United States Patent
Van Epps et al.

(10) Patent No.: US 7,162,375 B2
(45) Date of Patent: *Jan. 9, 2007

(54) DIFFERENTIAL TERMINATION AND ATTENUATOR NETWORK FOR A MEASUREMENT PROBE HAVING AN AUTOMATED COMMON MODE TERMINATION VOLTAGE GENERATOR

(75) Inventors: Richard A. Van Epps, Vancouver, WA (US); Ira G. Pollock, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 83 days.

This patent is subject to a terminal disclaimer.

(21) Appl. No.: 11/051,653

(22) Filed: Feb. 4, 2005

(65) Prior Publication Data

US 2006/0176074 A1    Aug. 10, 2006

(51) Int. Cl.
G01R 15/00 (2006.01)
G01R 27/28 (2006.01)
G01R 1/20 (2006.01)
G06F 19/00 (2006.01)
H03L 5/00 (2006.01)
H01P 1/22 (2006.01)
H03H 7/24 (2006.01)

(52) U.S. Cl. .................. 702/57; 702/64; 702/117; 324/126; 327/308; 333/81 R

(58) Field of Classification Search ............... 702/118, 702/57
See application file for complete search history.

(56) References Cited

U.S. PATENT DOCUMENTS 4,393,347 A * 7/1983 Looper ...................... 324/126
4,833,418 A * 5/1989 Quintus et al. ................ 330/9
6,590,436 B1 * 7/2003 Jordanger et al. .......... 327/333
6,629,048 B1    9/2003 Law et al.

* cited by examiner

Primary Examiner—John Barlow
Assistant Examiner—Lisa C. Sievers
(74) Attorney, Agent, or Firm—William K. Bucher

(57) ABSTRACT

A differential termination and attenuator network having an automated common mode termination voltage generator includes first and second termination resistors coupled in parallel with corresponding resistive attenuator circuits. A monitoring circuit coupled to input nodes of the network generates an output signal representative of the combination of a DC common mode voltage on the input nodes and an adjustable termination voltage. A control circuit generates scaled termination and compensation voltages and associated drive currents using the adjustable termination voltage and the monitoring circuit output signal. The scaled termination voltage and the scaled compensation voltage operate on the differential termination and attenuation network to optimize the dynamic range of a differential amplifier connected to the first and second attenuator outputs. An automated termination voltage generator automatically adjusts the adjustable termination voltage to match the DC common mode input voltage, which nulls the DC currents at the input nodes.

28 Claims, 8 Drawing Sheets though 50 ohm input terminations are usually connected to the measurement system ground, some applications require termination to a common mode DC termination voltage. The availability of an adjustable DC termination voltage in the measurement termination network allows control of the DC loading of the signal source, such as in a high speed serial data signal having a significant DC common mode component.

DIFFERENTIAL TERMINATION AND ATTENUATOR NETWORK FOR A MEASUREMENT PROBE HAVING AN AUTOMATED COMMON MODE TERMINATION VOLTAGE GENERATOR

BACKGROUND OF THE INVENTION

The present invention relates generally to differential measurement probes with input signal terminations and more particularly to a differential termination and attenuator network for a measurement probe having an automated common mode termination voltage generator for DC common mode voltage compensation.

High speed measurement systems generally feature a resistive input termination that matches the characteristic impedance of the input signal transmission line. This is done to minimize input signal reflection problems and provide the best signal fidelity. A dual 50 ohm input termination network is the most common topology for high speed differential systems. Although 50 ohm input terminations are usually connected to the measurement system ground, some applications require termination to a common mode DC termination voltage. The availability of an adjustable DC termination voltage in the measurement termination network allows control of the DC loading of the signal source, such as in a high speed serial data signal having a significant DC common mode component.

FIG. 1 is a schematic representation of a termination network 10 having an adjustable DC termination voltage $V_{TERM}$ used in the P7350SMA Differential Probe, manufactured and sold by Tektronix, Inc. The DC termination voltage $V_{TERM}$ is provided by an external source and is coupled to the common node of the termination resistors 12 and 14. The termination resistors 12 and 14 are 50 ohm resistors that typically match a 50 ohm differential source impedance of a device under test. The differential input signal is coupled via SMA input connectors 16 and 18 to the termination resistors 12 and 14 and to the inputs of high impedance attenuators 20 and 22. The opposite ends of the high impedance attenuators 20 and 22 are coupled to ground. Each attenuator 20 and 22 has a resistive voltage divider consisting of resistive elements 24 and 26 coupled in parallel with a compensating capacitive voltage divider consisting of capacitive elements 28 and 30. The intermediate nodes 32 of the resistive/capacitive voltage divider networks are coupled to the inverting and non-inverting inputs of a differential amplifier 34.

The matching of the DC termination voltage $V_{TERM}$ of the measurement probe to the DC common mode component of the input signal allows the input signal to be directly connected to the measurement probe inputs without AC coupling by minimizing the DC loading on the signal source. Since the DC termination voltage $V_{TERM}$ is supplied by an external source, the input DC common mode voltage needs to be measured and the external termination voltage set to match the input DC common mode voltage of the signal source. The high speed differential amplifier 34 generally has a limited input dynamic range. The high impedance input attenuators 20 and 22 are provided to extend the linear dynamic range of the high speed differential amplifier 34. The DC common mode voltage at the attenuators 20 and 22 outputs results from both the common mode component of the input signal and from the common mode termination voltage $V_{TERM}$ of the termination network. A well designed differential measurement amplifier 34 will have a very large common mode rejection ratio, CMRR, which largely eliminates the DC common mode voltage in the amplifier output signal. Any non-zero, DC common mode voltage present at the input of the differential amplifier 34, however, will reduce the effective linear dynamic range of the amplifier 34. A large DC common mode voltage in the input signal can easily overdrive the differential amplifier 34, making it impossible to measure the often small differential mode signal.

What is needed is an input differential termination and attenuation network for a measurement probe that automatically tracks the input DC common mode voltage and generates a DC termination voltage to null DC currents at the differential input nodes of the network. The input differential termination and attenuation network should monitor the input signal and generate a DC termination voltage that can be adjusted to produce zero loading of the DC component of the input signal source. The input differential termination and attenuation network should also provide a compensation voltage that produces the optimal dynamic range for the differential measurement amplifier.

SUMMARY OF THE INVENTION

Accordingly, the present invention is a differential termination and attenuator network coupled to a differential amplifier having an automated common mode termination voltage generator and a termination voltage control circuit receiving a DC common mode voltage from a voltage source having source resistances and coupled to a differential amplifier where the control circuit optimizes the dynamic range of the differential amplifier. The differential termination and attenuator network has first and second input termination resistances having a common node and respective input network nodes receiving the DC common mode voltage from the voltage source. The input network nodes are coupled to respective input nodes of first and second attenuators having a common node. A monitoring circuit is coupled to the input network nodes of the first and second input termination resistances for generating an output signal representative of the combination of a DC common mode voltage on the input network nodes and voltage representative of an adjustable termination voltage generated by the automated termination voltage generator. The monitoring circuit is preferably a resistive voltage divider network having high impedance inputs relative to the first and second input termination resistances. A control circuit receives the adjustable termination voltage from the automated termination voltage generator and the monitoring circuit output signal and generates a scaled termination voltage and drive current and a scaled compensation voltage and drive current that are a function of the adjustable termination voltage and the DC common mode voltage. The scaled termination voltage and drive current are coupled to the common node of the first and second input termination resistances and the scaled compensation voltage and drive current are coupled to the common node of the first and second attenuators. The scaled termination voltage and drive current and the scaled compensation voltage and drive current provide DC currents through the input termination resistances and the attenuators for nulling DC currents at the network input nodes and provide a DC common mode voltage output from the first and second attenuators for optimizing the dynamic range of the differential measurement amplifier.

Each input termination resistance is implemented as an input termination resistor coupled in parallel with one of the respective first and second attenuators. The attenuators are implemented with first and second resistors with one side of the first resistor coupled to one of the first and second input termination resistors and the other side coupled to one side of the second resistor at the output node of the attenuator and the other side of the second resistor coupled to receive the scaled compensation voltage at the common node of the first and second attenuators.

The scaled termination and scaled compensation voltages have scaling factors that are a function of the first and second input termination resistors and the first and second resistors of the respective first and second attenuators. The scaled termination voltage has a first scaling factor providing a first voltage proportional to the adjustable termination voltage and a second scaling factor providing a correction voltage proportional to the difference between the DC common mode voltage on the input network nodes of the first and second input termination resistances and the adjustable termination voltage. The scaled compensation voltage has a first scaling factor providing a first voltage proportional to the adjustable termination voltage and a second scaling factor providing a correction voltage proportional to the difference between the DC common mode voltage on the input network nodes of the first and second input termination resistances and the adjustable termination voltage. In the preferred embodiment of the invention, the scaled compensation voltage produces a substantially zero volts DC common mode voltage across the output nodes of the first and second attenuators.

The control circuit has a correction differential amplifier receiving as inputs the output signal from the monitoring circuit and the adjustable termination voltage. The correction differential amplifier generates an output signal representative of the difference between the output signal from the monitoring circuit and the adjustable termination voltage. A first summing node is coupled to receive the adjustable termination voltage and the output signal from the correction differential amplifier and generates an output signal representative of the adjustable termination voltage and an attenuated representation of the output signal from the correction differential amplifier. The output signal from the first summing node is coupled to a first drive amplifier having a scaling gain factor for generating the scaled termination voltage. A second summing node is coupled to receive the adjustable termination voltage and the output signal from the correction differential amplifier and generates an output signal representative of the adjustable termination voltage and the output signal from the correction differential amplifier. The output signal from the second summing node is coupled to a second drive amplifier having a scaling gain factor for generating the scaled compensation voltage.

In the preferred embodiment of the invention the first summing node has an attenuation circuit receiving the output signal from the correction differential amplifier and a summing amplifier. The summing amplifier has an input node coupled to receive the adjustable termination voltage and an attenuated representation of the output signal from the correction differential amplifier. The summing amplifier generates the output signal representative of the adjustable termination voltage and attenuated representation of the output signal from the correction differential amplifier.

A first implementation of the automated termination voltage generator receives the output signal from the monitoring circuit and generates an adjustable termination voltage substantially equal to the DC common mode voltage on the input nodes of the first and second input termination resistances. The automated termination voltage generator is a form of feedback control circuit because of the interaction between the input DC common mode voltage and the adjusted termination voltage that is sensed by the monitoring circuit. The automated termination voltage generator may be configured as an analog voltage feedback circuit or as a digital feedback circuit having an analog-to-digital converter receiving the output signal from the monitoring circuit for generating digital values representative of the monitoring circuit output signal. A microcontroller receives the digital values from the analog-to-digital converter and generates digital values representative of the adjustable termination voltage that is substantially equal to the DC common mode voltage on the input nodes of the first and second termination resistances. The digital values representative of the adjustable termination voltage are coupled to a digital-to-analog converter which generates an analog adjustable termination voltage. The analog-to-digital converter and the digital-to-analog converter may be incorporated into the microcontroller.

In the preferred implementation of the automated termination voltage generator, respective sensing circuits monitor the scaled termination voltage drive current and the scaled compensation voltage drive current and generate respective output voltages representative of the drive currents. The output voltages from the sensing circuits are combined at a summing node and coupled to the input of a integrating amplifier for generating the adjustable termination voltage that is coupled to the control circuit. The integrating amplifier is part of the feedback circuit that adjusts the termination voltage to null the input signal DC current. The null condition occurs when the adjustable termination voltage matches the input DC common mode voltage resulting in minimum input DC loading. Each of the automated termination voltage generator sensing circuits has a low resistance sensing resistor coupled in series with the output of one of the first and second drive amplifiers for generating an output voltage from each side of the sensing resistor. The output voltages on either side of the sensing resistor are coupled to inverting and non-inverting inputs of a differential gain amplifier whose amplified output represents one of the scaled termination voltage drive current or the scaled compensation voltage drive current.

The differential termination and attenuator network having an automated common mode termination voltage generator may further include an adjustable termination voltage monitoring circuit to detect exception conditions. The adjustable termination voltage monitoring circuit, which may need to be scaled and offset, is coupled to a microcontroller that converts the scaled and offset adjustable termination voltage to digital values for processing by the microcontroller. The microcontroller generates an output control signal when the scaled and offset adjustable termination voltage is greater than a threshold level. The threshold level might be exceeded, for example, when the input signal is AC-coupled and no DC signal current is available to keep the integrating amplifier from saturating. The output signal is coupled to a switch that disconnects the automated termination voltage generator and forces the adjustable termination voltage to zero volts via a pull-down resistor. The microcontroller also receives the output signal from the input network monitoring circuit and converts the output signal to digital values. This signal can be used to sense when the exception condition is no longer present. The microcontroller processes the digital values and generates a control signal when the output signal from the input network monitoring circuit is greater than a threshold value to reconnect the automated termination voltage generator.

An overload current monitoring circuit having a window comparator may also be coupled to receive the output voltage representative of the scaled termination voltage drive current from the sensing circuits. The window comparator also receives positive and negative reference voltages which are compared to the output voltage for generating an active-LO output signal when the output voltage from the sensing circuit exceeds the positive and negative reference voltages. The active-LO output signal is coupled to a microcontroller that activates an overload indicator display as long as the overload condition is present.

The objects, advantages and novel features of the present invention are apparent from the following detailed description when read in conjunction with appended claims and attached drawings.

DETAILED DESCRIPTION OF THE PREFERRED EMBODIMENT

Figure 1:
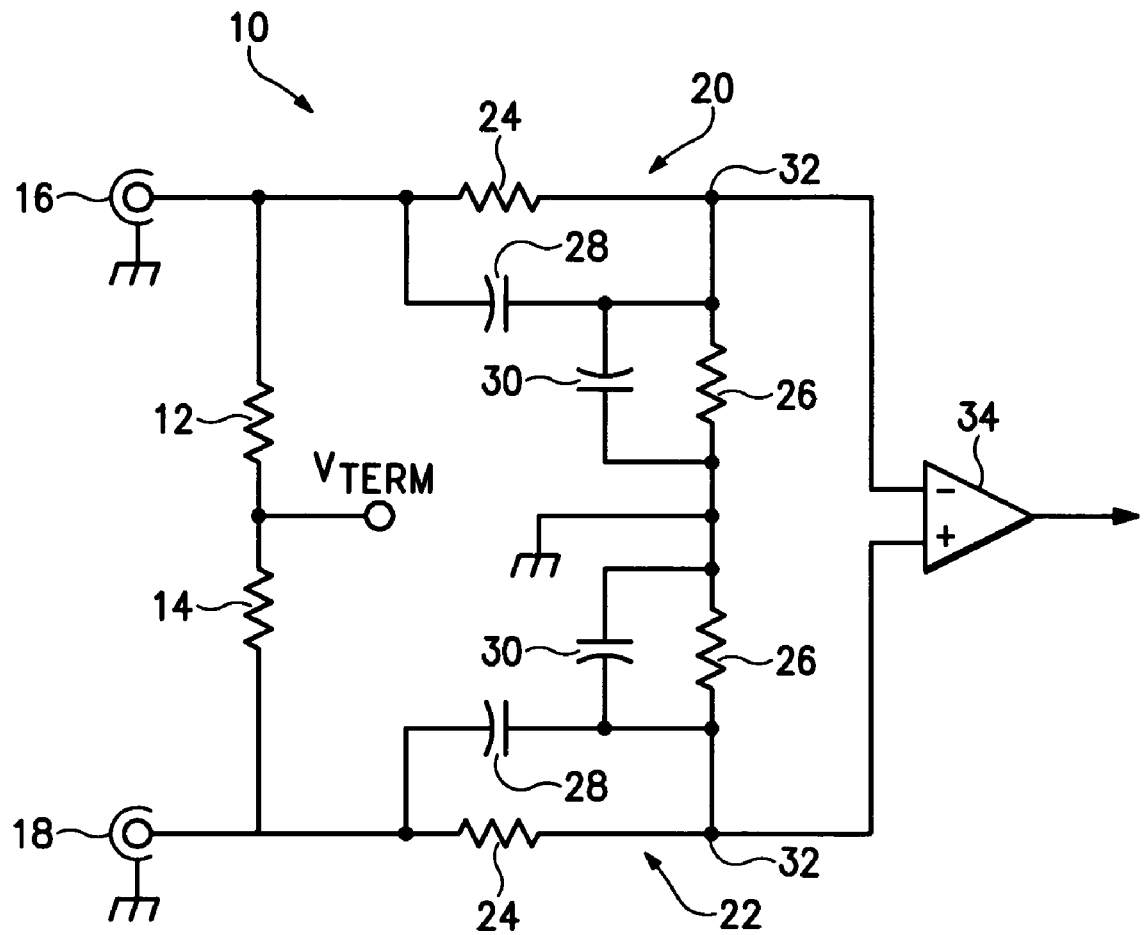
FIG. 1 is a schematic representation of a prior art input differential termination and attenuator network.
Figure 2:
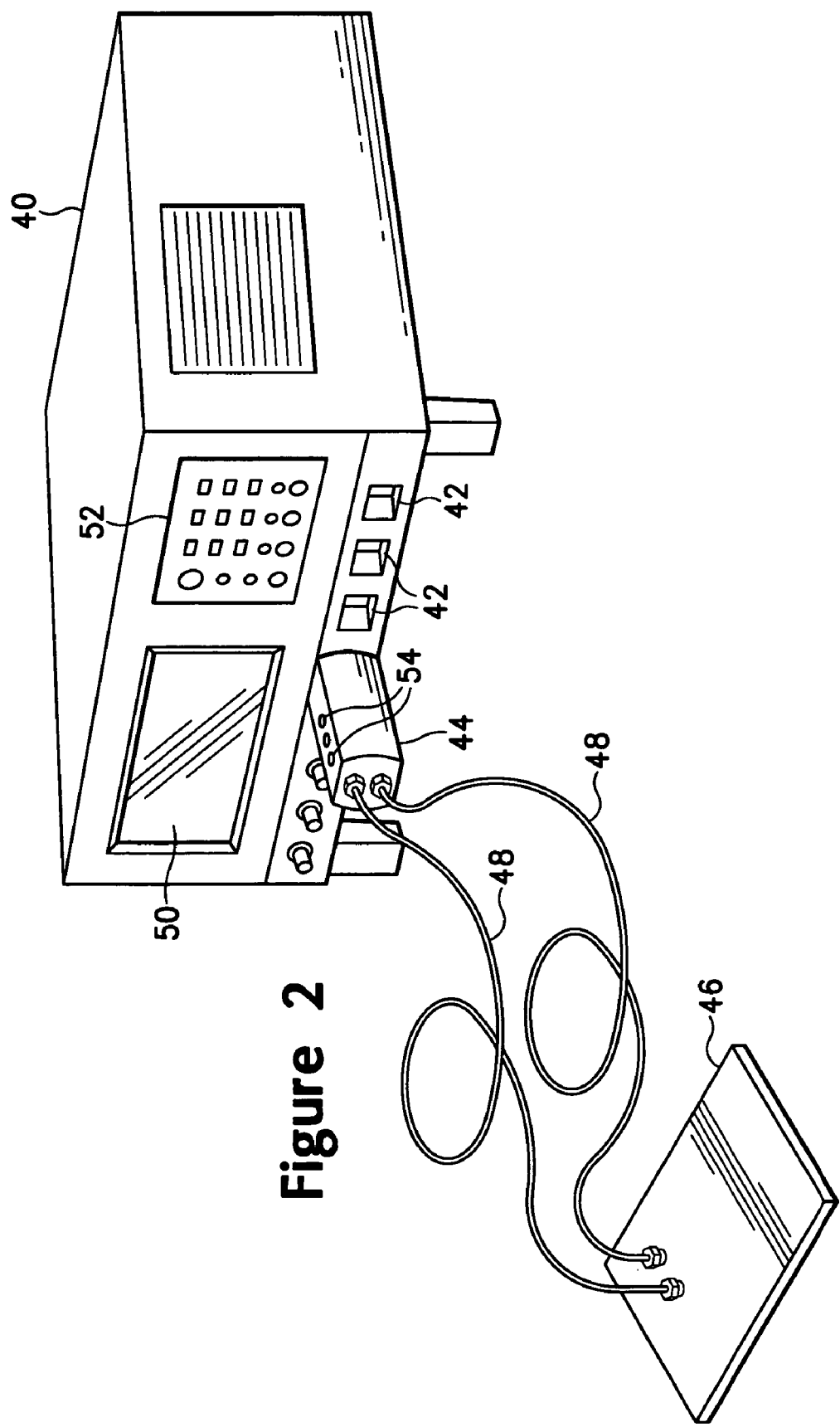
FIG. 2 is a perspective view of a measurement instrument having a measurement probe incorporating the input differential termination and attenuator network having an automated common mode termination voltage generator according to the present invention.

Referring to FIG. 2, there is shown a measurement test instrument 40, such as a TDS6804B oscilloscope manufactured and sold by Tektronix, Inc. The oscilloscope 40 has multiple accessory interfaces 42 for connecting one or more accessory devices 44 to the oscilloscope, such as a differential measurement probe incorporating the input differential termination and attenuator network having an automated termination voltage generator of the present invention. Each accessory interface 42 has a coaxial signal input line and voltage power, clock, data, sensing and memory power lines as described in U.S. Pat. No. 6,629,048 B1, titled "Measurement Test Instrument and Associated Voltage Management System for Accessory Device" and incorporated by reference in its entirety. The accessory interface 42 provides voltage power from the oscilloscope 40 to the measurement probe 44 and bidirectional communications between the oscilloscope 40 and the probe 44. The differential measurement probe 44 is coupled to a device under test 46 via SMA terminated coaxial cables 48. The oscilloscope 40 has a display device 50 on which is displayed a graphical user interface and processed signals from a device under test 46. Generally, the measurement test instrument 40 includes front panel controls 52, such as rotatable knobs, push buttons and the like for controlling the settings of the instrument. Alternatively, the front panel controls may be graphically generated and displayed on the display device 50 and controllable by the user. The differential measurement probe may also include status indicator devices 54, such as light emitting diodes (LED) or the like.

Figure 3:
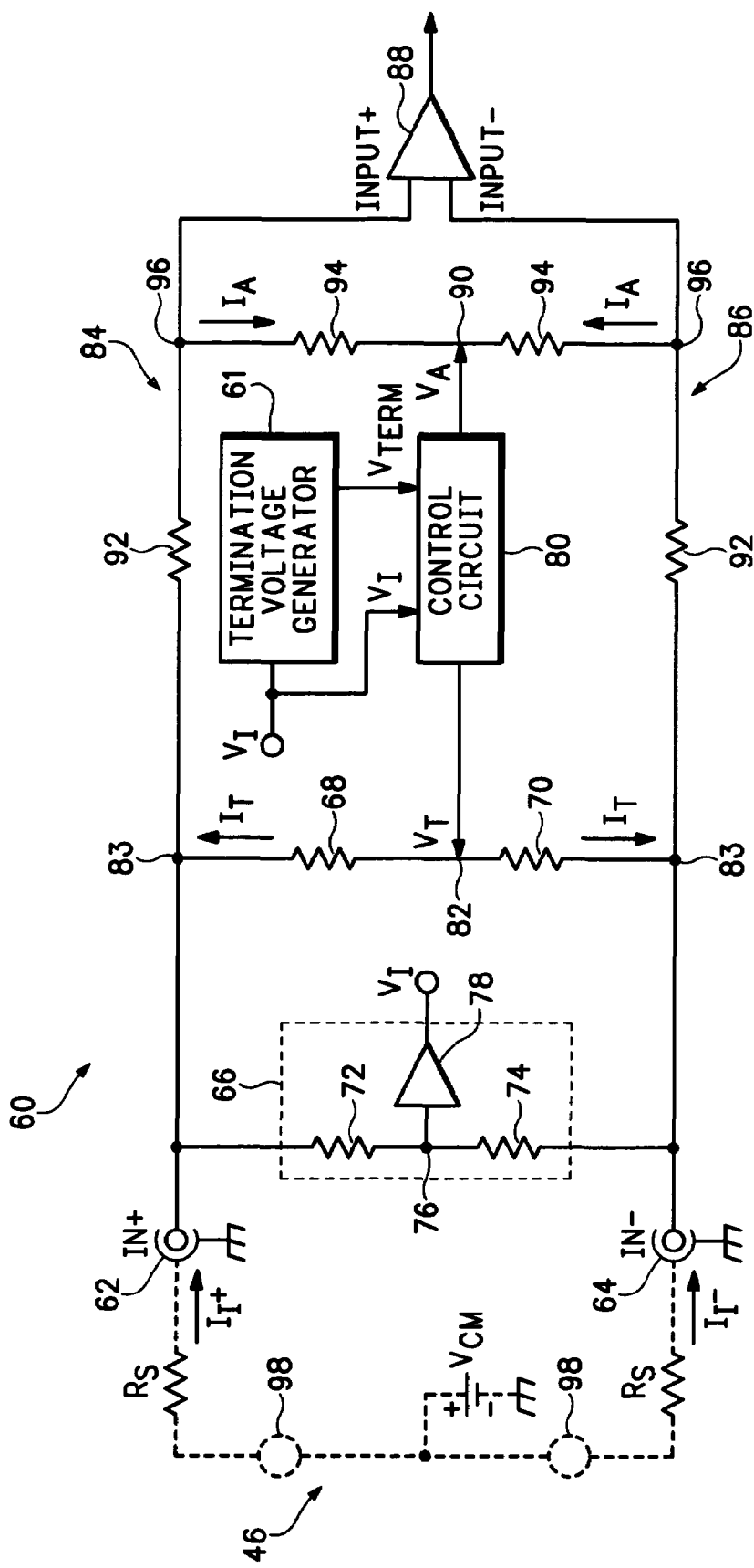
FIG. 3 is a representative block diagram of the input differential termination and attenuator network having an automated common mode termination voltage generator according to the present invention.

Referring to FIG. 3, there is shown a schematic block diagram of the input differential termination and attenuation network 60 having an automated common mode termination voltage generator 61 incorporated into the differential measurement probe 44. The input differential termination and attenuation network 60 receives differential input signals, IN+, IN−, from the device under test 46 at inputs 62 and 64. The combination of the input DC common mode voltage $V_{CM}$ and the adjustable termination voltage $V_{TERM}$ is dependent on the relative values of the input source resistance $R_S$ ands the effective termination resistances. The device under test 46 may be modeled as a DC common mode signal source, $V_{CM}$, a pair of complementary differential mode sources 98, and a differential source impedance represented by resistor $R_S$. The input signals are coupled to a monitoring circuit 66 and termination resistors 68 and 70. The monitoring circuit 66 detects the input DC common mode voltage $V_{CM}$ of the signal source and generates an output signal $V_I$ representative of the combination of the input DC common mode voltage $V_{CM}$ and a voltage representative of an adjustable termination voltage $V_{TERM}$ generated by the automated termination voltage generator 61. The monitoring circuit 66 has resistive elements 72 and 74 that present a high impedance to the input DC common mode voltage $V_{CM}$ relative to the effective input termination resistances. In the preferred embodiment the resistive elements 72 and 74 have resistive values of approximately 5000 ohms. The resistive elements 72 and 74 form a voltage divider network between the inputs 62 and 64. The common node 76 of the voltage divider network provides the output voltage $V_I$ that is coupled through a buffer amplifier 78 to the automated termination voltage generator 61 and to a control circuit 80. The automated termination voltage generator 61 generates an adjustable termination voltage $V_{TERM}$ that tracks the input DC common mode voltage $V_{CM}$. The adjustable termination voltage output $V_{TERM}$ from the termination voltage generator 61 is coupled to the control circuit 80.

The termination resistors 68 and 70 have a common node 82 that receives a scaled termination voltage $V_T$ and drive current $I_T$ from the control circuit 80. Each termination resistor 68 and 70 is coupled to one of the input nodes 83 of attenuators 84 and 86 with each attenuator being coupled in parallel with one of the termination resistors 68 and 70. Each attenuator has series coupled attenuation resistors 92 and 94 with the output node 96 between the resistors 92 and 94 coupled to one of the inputs of the differential amplifier 88.

The attenuators 84 and 86 have a common node 90 that receives a scaled compensation voltage $V_A$ and drive current $I_A$ from the control circuit 80. The control circuit 80 generates the scaled termination voltage $V_T$ and drive current $I_T$ and scaled compensation voltage $V_A$ and drive current $I_A$ that are a function of the generated adjustable termination voltage $V_{TERM}$ and the input DC common mode voltage $V_{CM}$.

The input differential termination and attenuation network 60 having an automated common mode termination voltage generator 61 operates to automatically generate the adjustable termination voltage $V_{TERM}$ to null the DC currents at the inputs 62 and 64 when the input DC common mode voltage $V_{CM}$ equals the adjustable termination voltage $V_{TERM}$ and the input source resistances are matched. Further, the present invention sets the DC common mode voltage at the output nodes 96 of the attenuators 84, 86 to optimize the dynamic range of the differential amplifier 88 for differing levels of the DC common mode voltage $V_{CM}$ and the adjustable termination voltage $V_{TERM}$. The scaled termination voltage $V_T$ and drive current $I_T$ in conjunction with the scaled compensation voltage $V_A$ and drive current $I_A$ generate DC currents through the termination resistors 68 and 70 and the attenuators 84 and 86 to produce a voltage equivalent to the adjustable termination voltage $V_{TERM}$ at the effective termination resistances connected to inputs 62 and 64. The DC currents further produce a DC common mode voltage at the output nodes 96 of the attenuators 84 and 86 that optimize the dynamic range of the differential amplifier 88. In the preferred embodiment of the invention, the DC common mode voltage at the output nodes 96 of the attenuators 84 and 86 is set to a substantially fixed zero volts which provides the optimum dynamic range for the differential amplifier 88. The generalized equations for the control circuit to set the voltage equivalent to the adjustable termination voltage $V_{TERM}$ at the inputs 62 and 64 and set the DC common mode voltage at the output nodes 96 of the attenuators 84 and 86 for optimizing the differential amplifier 88 dynamic range are as follows. The equation for the scaled termination voltage $V_T$ is:

$$V_T = A \times V_{TERM} + B \times (V_I - V_{TERM})$$

and the equation for the scaled compensation voltage $V_A$ is:

$$V_A = -C \times V_{TERM} - D \times (V_I - V_{TERM})$$

where A, B C and D are scalars that are a function of the resistive values of the termination resistors 68, 70 and the attenuation resistors 92, 94. The equations are valid for the specific conditions of matched source impedance inputs and differential mode AC signals with a common mode DC component. Where the input DC common mode input voltage $V_{CM}$ and the adjustable termination voltage $V_{TERM}$ are equal, the $V_T$ and $V_A$ voltages are proportional to the adjustable termination voltage $V_{TERM}$ as represented by the equation terms $A \times V_{TERM}$ and $-C \times V_{TERM}$. Voltage difference variations between the input DC common mode input voltage $V_{CM}$ and the adjustable termination voltage $V_{TERM}$ may be corrected by adding correction factors to the $V_T$ and $V_A$ equations. The corrections factors are derived from the detection of the combination of the input DC common mode input voltage $V_{CM}$ and the voltage representative of the adjustable termination voltage $V_{TERM}$ using the monitoring circuit 66 and applying the output signal $V_I$ to the control circuit 80 to generate the equation correction terms $B \times (V_I - V_{TERM})$ and $-D \times (V_I - V_{TERM})$. The input differential termination and attenuation network 60 uses the automated termination voltage generator 61 to adjust the adjustable termination voltage $V_{TERM}$ to match the input DC common mode voltage $V_{CM}$ by detecting the combination of the input DC common mode input voltage $V_{CM}$ and the adjustable termination voltage $V_{TERM}$ and generating a scaled termination voltage $V_T$ and drive current $I_T$ and a scaled compensation voltage $V_A$ and drive current $I_A$ that null the DC currents at the inputs 62 and 64 of the circuit 60 and drive the output nodes 96 of the attenuators 84 and 86 to a substantially fixed zero volt level for the optimum dynamic range of the differential amplifier 88.

In the preferred embodiment of the invention, the input differential termination and attenuation network 60 having the automated termination voltage generator 61 is optimally designed to receive the differential signal from an input source having a differential 50 ohm impedance and a DC common mode voltage $V_{CM}$. The termination resistors 68, 70 have nominal resistive values of 66.7 ohms. The termination resistors 68, 70 are in parallel with attenuation resistors 92, 94 having respective nominal resistive values of 120 and 80 ohms. The effective input resistance resulting from the termination resistors 68, 70 in parallel with the attenuation resistors 92, 94 is 50 ohms to a common mode termination voltage $V_{TERM}$ for each side of the differential network. The attenuation factor for each of the attenuators 84, 86 is 2.5×. The effective input resistance and attenuation factor are but one implementation of the present invention and other effective input termination resistances and attenuation factors may be used without departing from the scope of the present invention.

The derivations of the scaled termination voltage $V_T$ and scaled compensation voltage $V_A$ are described below for matched 50 ohm source impedance inputs and differential mode AC signals with a common mode DC component. The desired DC voltages at the inputs 62 and 64 are represented by the equation:

$$IN+ = IN- = \frac{(V_{CM} + V_{TERM})}{2}$$

where IN+ and IN− are the common mode DC voltage components on the inputs 62 and 64, $V_{CM}$ is the common mode voltage applied through the source resistances $R_S$ to the inputs 62 and 64, and $V_{TERM}$ is the adjustable termination voltage generated by the termination voltage generator 61. The desired common mode DC voltages on the inverting and non-inverting inputs of the differential amplifier 88 should be 0 volts DC to achieve the maximum dynamic range for the amplifier as represented by the equation:

$$INPUT+ = INPUT- = 0$$

The $V_T$ and $V_A$ voltages from the control circuit 80 are dependent on the $V_{CM}$ common mode voltage at the inputs 62 and 64 and can be solved to satisfy the above equations. For the case where $V_{CM} = V_{TERM}$, the voltages $V_T$ and $V_A$ are both proportional to $V_{TERM}$:

$$V_T = 1.5556 \times V_{TERM}$$

$$V_A = -0.6667 \times V_{TERM}$$

where 1.5556 and 0.6667 are proportional scalars that are a function of the values of the termination resistors 68, 70 and the attenuation resistors 92, 94.

If the $V_T$ and $V_A$ voltages are scaled versions of $V_{TERM}$, then variations between the input DC common mode voltage signal $V_{CM}$ and the adjustable termination voltage $V_{TERM}$ at the inputs 62 and 64 represent the average voltage between input DC common mode voltage signal $V_{CM}$ and $V_{TERM}$ when the input source resistances match the termination resistances. However, the voltage inputs, INPUT+ and INPUT−, to the inverting and non-inverting nodes of the differential amplifier 88 are not held at zero volts as the input DC common mode voltage signal $V_{CM}$ varies, but ranges over an attenuated percentage of the $V_{CM}$ value as represented by the following equation:

INPUT+=INPUT−=0.2×($V_{CM}$−$V_{TERM}$)

The monitoring circuit 66 detects the combination of the input DC common mode voltage $V_{CM}$ and the voltage representative of the adjustable termination voltage $V_{TERM}$ and generates an output signal $V_I$ that is coupled to the control circuit 80 for adjusting the $V_T$ and $V_A$ voltages and in some embodiments of the invention to the automated termination voltage generator 61 for generating the adjustable termination voltage $V_{TERM}$ and the control circuit 80 for adjusting the $V_T$ and $V_A$ voltages. For the case where the input signal is supplied by a 50 ohm source, the following relationship exists between the sensed voltage $V_I$ and the input common mode voltage $V_{CM}$:

$$V_I = \frac{V_{CM} + V_{TERM}}{2} \;=\; > V_{CM} = 2 \times V_I - V_{TERM}$$

It is possible for the 2.5× attenuator to compensate for the $V_{CM}$ input by adding correction factors to the $V_T$ and $V_A$ voltages of the form:

$\Delta V_T$=0.1111×($V_{CM}$−$V_{TERM}$)

$\Delta V_A$=−0.3333×($V_{CM}$−$V_{TERM}$)

where 0.1111 and 0.3333 are proportional scalars that are a function of the values of the termination resistors 68, 70 and the attenuation resistors 92, 94. Using the above equation for the relationship between $V_{CM}$ and $V_I$, it can be seen that:

($V_{CM}$−$V_{TERM}$)=2×($V_I$−$V_{TERM}$)

Substituting the above expression into the correction factor terms $\Delta V_T$ and $\Delta V_A$, the scaled termination voltage $V_T$ and the scaled compensation voltage $V_A$ become:

$V_T$=1.5556×$V_{TERM}$+0.2222×($V_I$−$V_{TERM}$)

$V_A$=−0.6667×$V_{TERM\ b}$ −0.6667×($V_I$−$V_{TERM}$)

The resistive elements 72 and 74 of the monitoring circuit 66 present a high impedance to the input DC common mode voltage $V_{CM}$ relative to the effective input termination resistances, they allow monitoring of the voltage across the termination resistors 68, 70 without loading the input differential termination and attenuation network 60. Neglecting the loading of the resistive elements 72 and 74 in the monitoring circuit 66, an analysis of the termination portion of the network 60 shows that the output signal of the monitoring circuit 66, $V_I$, is the superposition of the input DC common mode voltage, $V_{CM}$, and the adjustable termination voltage, $V_{TERM}$:

$$V_I = \left(\frac{R_S}{R_S + 50}\right) \times V_{TERM} + \left(\frac{50}{R_S + 50}\right) \times V_{CM}$$

where the effective input circuit is 50 ohms. In the special case where $V_{TERM}$ equals $V_{CM}$, then $$V_I = \left(\frac{R_S}{R_S + 50}\right) \times V_{CM} + \left(\frac{50}{R_S + 50}\right) \times V_{CM}$$

$$= \left(\frac{R_S + 50}{R_S + 50}\right) \times V_{CM}$$

$$= V_{CM}$$

Since in this case $V_I=V_{CM}$, then the input current from the complementary differential mode sources and the load current from the termination voltage source are equal to zero. The results of this termination network analysis suggest several different implementations for the automated termination voltage generator 61 that will automatically track the input DC common mode voltage $V_{CM}$.

Figure 4:
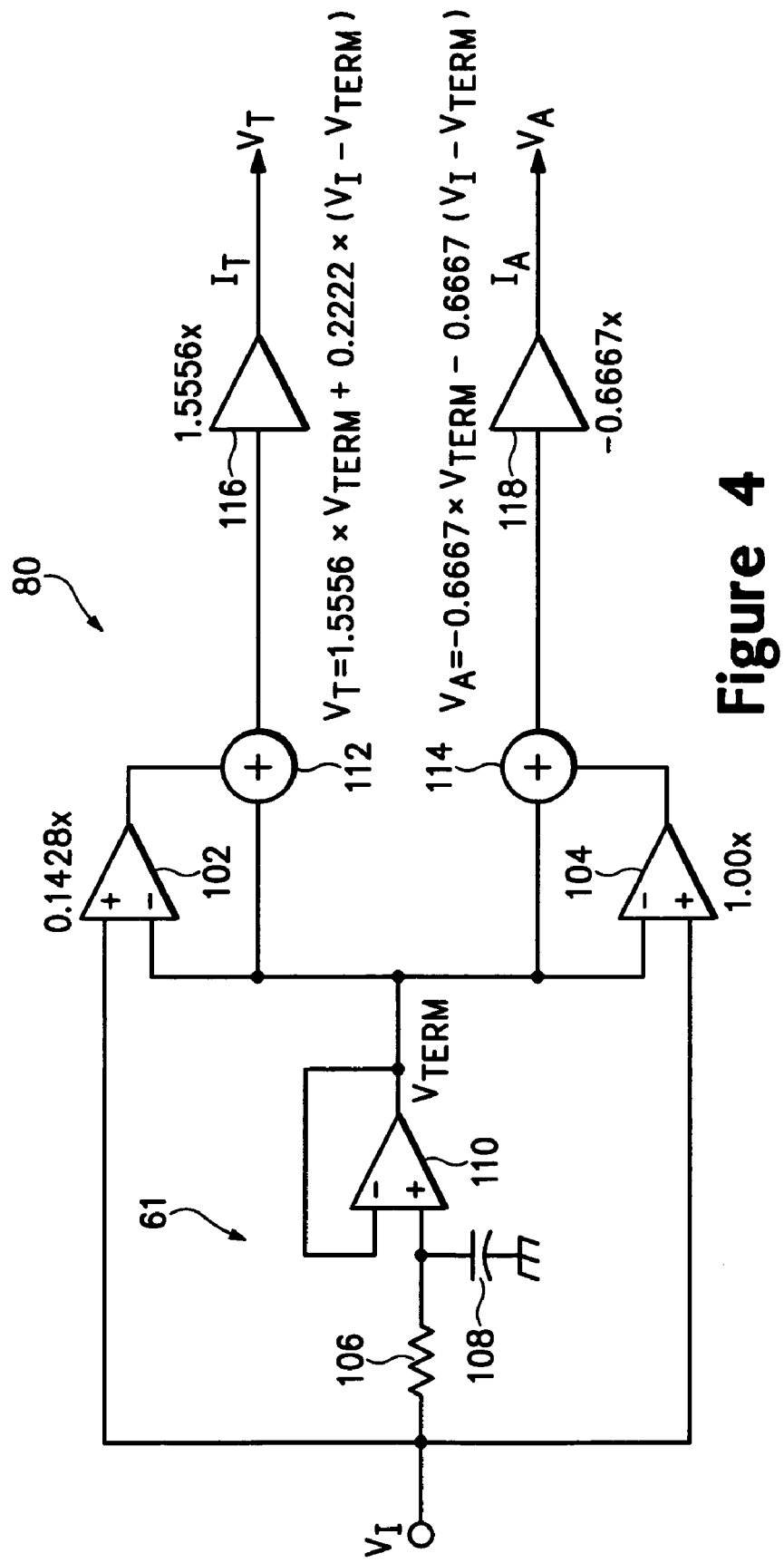
FIG. 4 is a functional schematic diagram of the control circuit and a first embodiment of the automated termination voltage generator in the input differential termination and attenuator network having an automated common mode termination voltage generator according to the present invention.

Referring to FIG. 4, there is shown a functional schematic diagram of the control circuit 80 with a first embodiment of the automated termination voltage generator 61. The output signal $V_I$ from the monitoring circuit 66 representing the combination of the input DC common mode voltage $V_{CM}$ and the voltage representing the adjustable termination voltage $V_{TERM}$ is coupled to the automated termination voltage generator 61 and the plus input nodes of differential gain amplifiers 102 and 104 in the control circuit 80. The automated termination voltage generator 61 is preferably formed as a voltage feedback circuit having an RC filter circuit consisting of resistor 106 and capacitor 108 coupled to non-inverting node of operation amplifier 110 with the inverting node of the amplifier 110 coupled to the output node. The output of the operational amplifier 110 is the adjustable termination voltage $V_{TERM}$. Since the $V_I$ output signal from the monitoring circuit 66 is the combination of the input DC common mode voltage $V_{CM}$ and the voltage representative of the adjustable termination voltage $V_{TERM}$ at the inputs 62 and 64, the voltage feedback circuit effectively adjusts $V_{TERM}$ to equal $V_{CM}$.

The adjustable termination voltage $V_{TERM}$ is coupled to minus inputs nodes of the differential gain amplifiers 102 and 104 as well as summing nodes 112 and 114. Differential gain amplifier 102 has a gain of 0.1428× and differential gain amplifier 104 has a gain of 1.00×. The output of differential gain amplifier 102 is 0.1428×($V_I$−$V_{TERM}$) which is applied to the summing node 112. The output of the summing node 112 is $V_{TERM}$+0.1428 ×($V_I$−$V_{TERM}$) which is coupled to the input of driver amplifier 116 having a gain of 1.5556×. The output of the driver amplifier 116 is the scaled termination voltage $V_T$ having an output equal to $V_T$=1.5556×$V_{TERM}$+0.2222×($V_I$−$V_{TERM}$) and the scaled termination voltage drive current $I_T$. The output of differential gain amplifier 104 is 1.00×($V_I$−$V_{TERM}$) which is applied to the summing node 114. The output of the summing node 114 is $V_{TERM}$+($V_I$−$V_{TERM}$) which is coupled to the input of drive amplifier 118 having a gain of −0.6667×. The output of the drive amplifier 118 is the scaled compensation voltage $V_A$ having an output equal to $V_A$=−0.6667×$V_{TERM}$−0.6667×($V_I$−$V_{TERM}$) and the scaled compensation voltage drive current $I_A$.

In the above circuit, if input DC common mode voltage $V_{CM}$ is greater than the adjustable termination voltage $V_{TERM}$, then the output signal from the monitoring circuit 66 $V_I$ is also greater than $V_{TERM}$. This results in $V_{TERM}$ increasing until $V_{TERM}$ is equal to $V_{CM}$. Similarly, if $V_{CM}$ is less than $V_{TERM}$, them $V_I$ is also less than $V_{TERM}$. This causes $V_{TERM}$ to decrease until $V_{TERM}$ is equal to $V_{CM}$. The automated termination voltage generator 61 should also result in $V_{TERM}$ tracking the value of $V_{CM}$ as the voltage difference between $V_I$ and $V_{TERM}$ nulls to zero with the resulting currents at the input nodes 62 and 64 nulling to zero.

Figure 5:
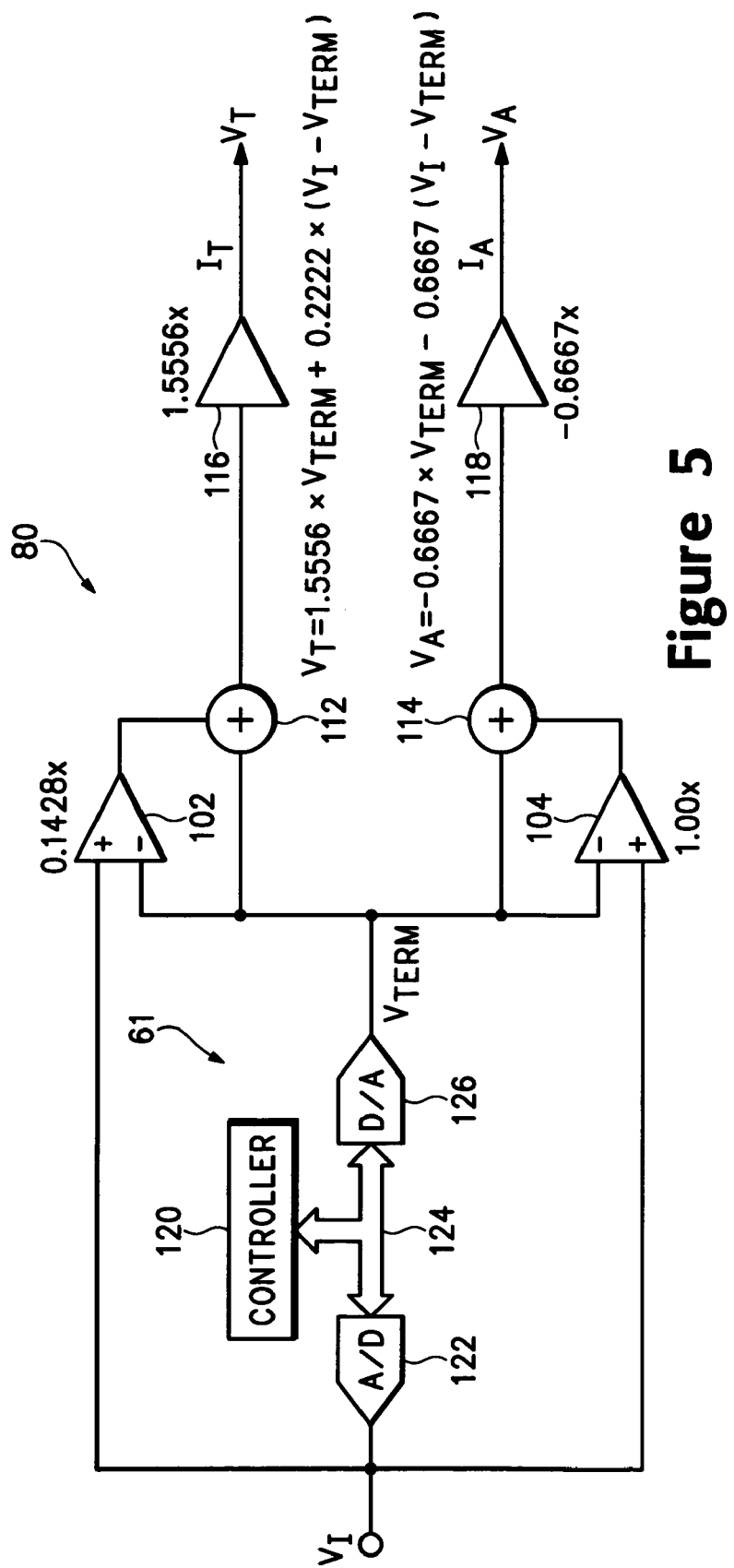
FIG. 5 is a functional schematic diagram of the control circuit and another embodiment of the automated termination voltage generator in the input differential termination and attenuator network having an automated common mode termination voltage generator according to the present invention.

Referring to FIG. 5, there is shown the functional schematic diagram of the control circuit 80 with a further embodiment of the automated termination voltage generator 61. Like elements from the previous drawing figures are labeled the same. The automated termination voltage generator 61 is implemented using a microcontroller 120 and mixed signal conversion techniques. The output signal $V_I$ from the monitoring circuit 66 is coupled to an analog-to-digital (A/D) converter 122 and digitally encoded. The digitally encoded $V_I$ signal is coupled via a signal bus 124 to the microcontroller 120 which processes the data using stored algorithms to generate digital values representative of the adjustable termination voltage $V_{TERM}$. The digital adjustable termination voltage values are coupled via the signal bus 124 to a digital-to-analog (D/A) converter 126 that converts the digital adjustable termination voltage values to analog voltages that are applied to the differential gain amplifiers 102 and 104 and the summing nodes 112 and 114. While the above implementation of the termination voltage generator 61 has been described with discrete A/D and D/A converters 122 and 126, connecting signal bus 124 and microcontroller 120, the automated termination voltage generator 61 may equally be implemented using a microcontroller having internal A/D and D/A converters.

Figure 6:
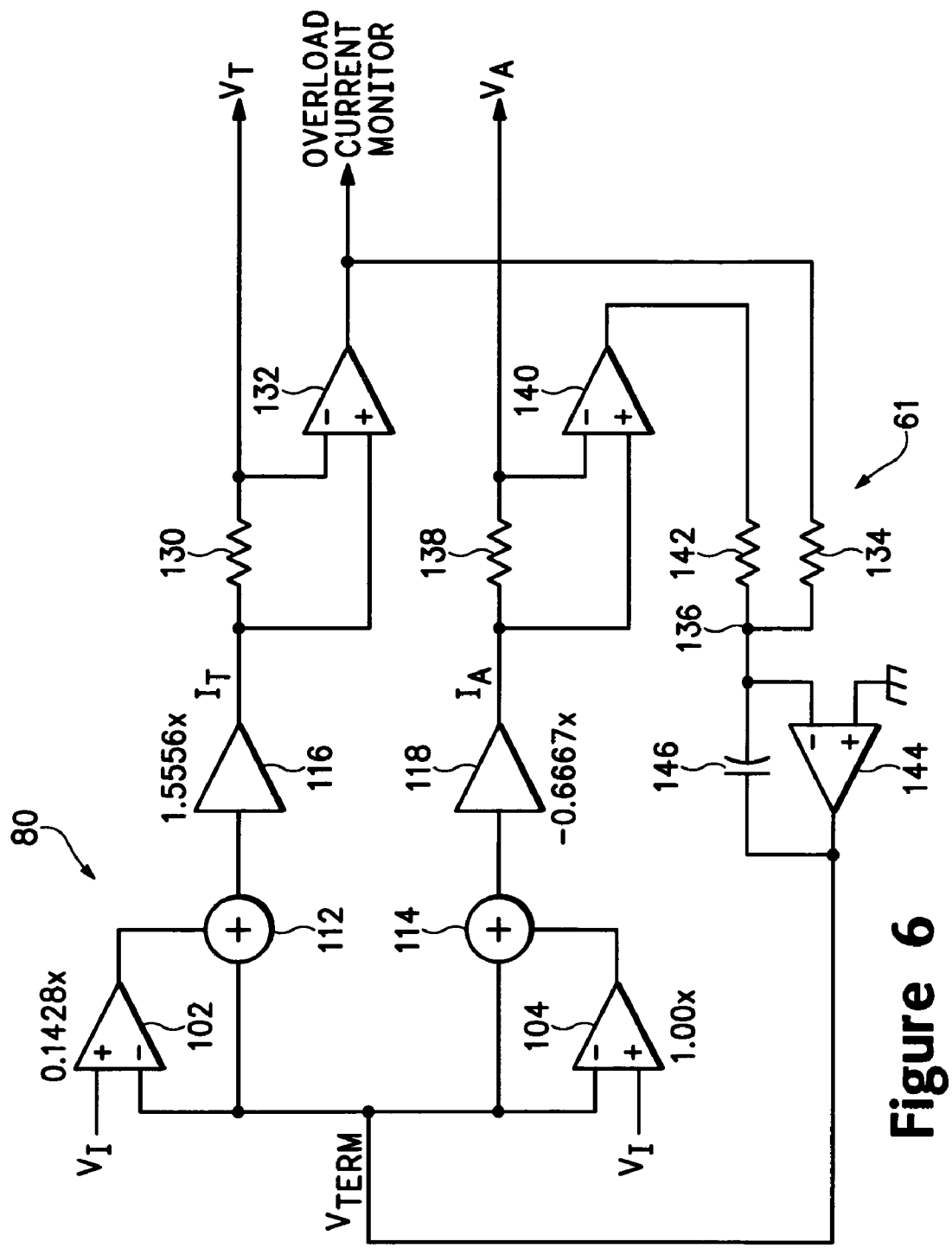
FIG. 6 is a functional schematic diagram of the control circuit and a further embodiment of the automated termination voltage generator in the input differential termination and attenuator network having an automated common mode termination voltage generator according to the present invention.

Referring to FIG. 6, there is shown the functional schematic diagram of the control circuit 80 with the preferred embodiment of the automated termination voltage $V_{TERM}$ generator 61. Like elements from the previous drawing figures are labeled the same. The drive amplifiers 116 and 118 generate respective drive currents $I_T$ and $I_A$ that are equal and opposite when the input DC common mode voltage $V_{CM}$ is equal to the applied termination voltage $V_{TERM}$. By monitoring the drive currents $I_T$ and $I_A$, the difference between the two currents can be nulled. The input signal current $I_I$ from the device under test 46, which is the sum of currents $I_I+$ and $I_I-$ shown in FIG. 3, will be zero when the scaled termination voltage current $I_T$ from the drive amplifier 116 and the scaled compensation voltage current $I_A$ from the drive amplifier 118 are equal and opposite in polarity.

The drive amplifier 116 output current $I_T$ is monitored by sensing the voltage drop across a series coupled sense resistor 130. The voltages on either side of the sense resistor 130 are coupled to respective inverting and non-inverting inputs of differential gain amplifier 132. The amplified output of the differential gain amplifier 132 representing the scaled termination voltage drive current $I_T$ is coupled through resistor 134 to summing node 136. In a similar manner, the output current of the drive amplifier 118 is monitored by sensing the voltage drop across a series coupled sense resistor 138. The voltages on either side of the sense resistor 138 are coupled to respective inverting and non-inverting inputs of differential gain amplifier 140. The amplified output of the differential gain amplifier 140 representing the scaled compensation voltage drive current $I_A$ is coupled through resistor 142 to the summing node 136. In the preferred embodiment, the differential gain amplifiers 132 and 140 are instrumentation amplifiers having high impedance differential inputs and very small DC error, which is important for millivolt signal measurements. In the described implementation, the gains of the differential gain amplifiers 132 and 140 are set to a factor of 201. The voltage outputs from the differential gain amplifiers 132 and 140 are summed at the summing node 136 and coupled to the inverting input of error integrator amplifier 144 having an integrator capacitor 146 coupled from the inverting input to the output of the amplifier 144. The error integrator amplifier 144 generates the adjustable termination voltage $V_{TERM}$ that is coupled to the differential gain amplifiers 102 and 104 and summing nodes 112 and 114.

In the above circuit, if the input DC common mode voltage $V_{CM}$ is greater than the adjustable termination voltage $V_{TERM}$, then the output signal $V_I$ from the monitoring circuit 66 is greater than $V_{TERM}$, which causes the input signal current $I_I$ to be positive and the scaled termination voltage drive current $I_T$ from the drive amplifier 116 to be greater than the scaled compensation voltage drive current $I_A$ from the drive amplifier 118. This causes the adjustable termination voltage $V_{TERM}$ to increase until $V_{TERM}$ equals $V_{CM}$. Similarly, if the input DC common mode voltage $V_{CM}$ is less than the adjustable termination voltage $V_{TERM}$, then $V_I$ is less than $V_{TERM}$, which causes the input signal current $I_I$ to be negative and scaled termination voltage drive current $I_T$ to be less than the scaled compensation voltage drive current $I_A$. This causes $V_{TERM}$ to decrease until $V_{TERM}$ equals $V_{CM}$. The automated termination voltage generator 61 results in the adjustable termination voltage $V_{TERM}$ tracking the value of the input DC common mode voltage $V_{CM}$ as the input signal current IThd I nulls to zero.

Figure 7:
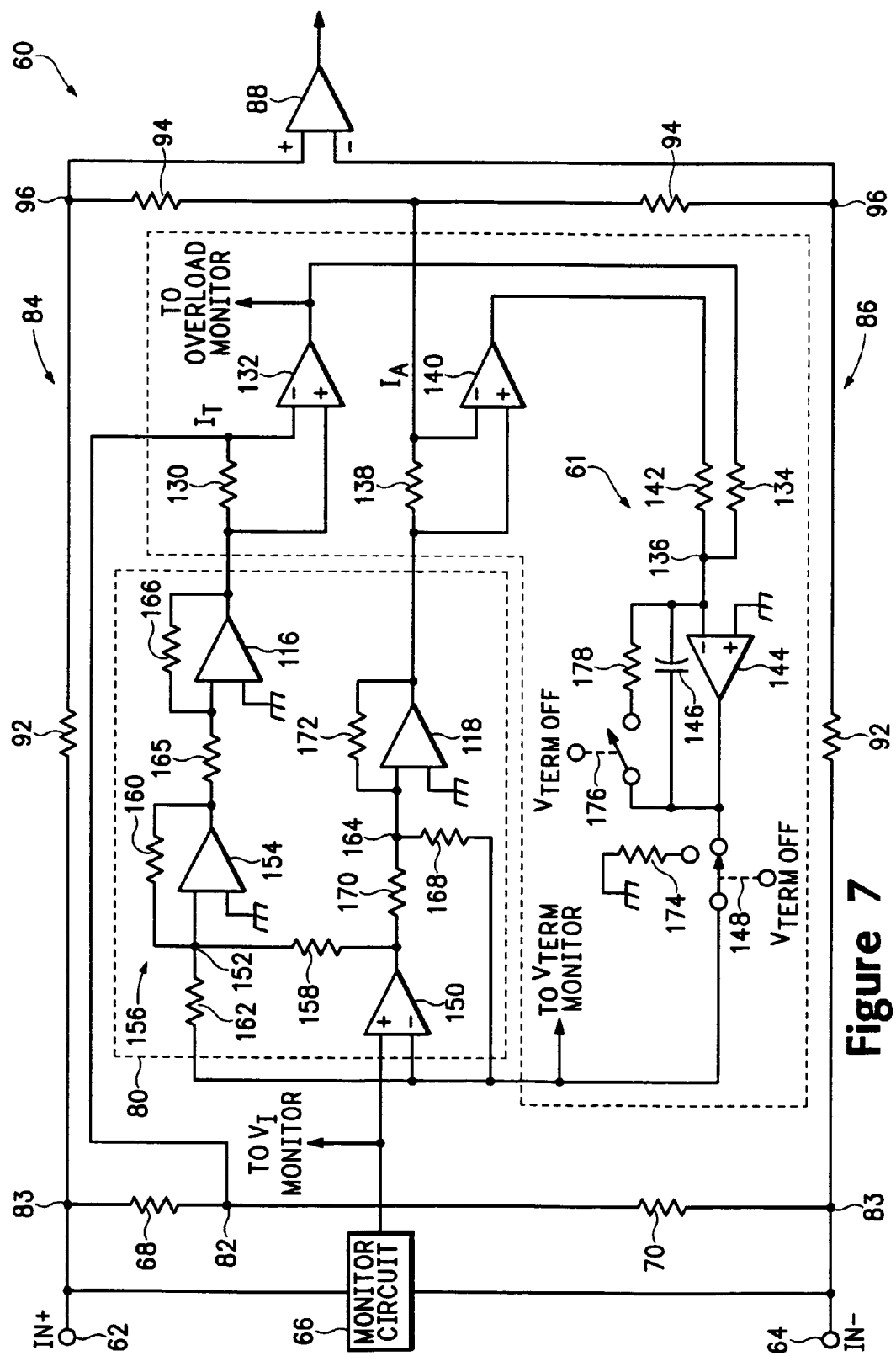
FIG. 7 is schematic representation of the preferred embodiment of the input differential termination and attenuator network having an automated common mode termination voltage generator according to the present invention.

Referring to FIG. 7, there is shown a schematic representation of the preferred embodiment of the input differential termination and attenuator network 60 having an automated common mode termination voltage generator 61 according to the present invention. The differential input signals, IN+, IN−, are coupled via the inputs 62 and 64 to the monitoring circuit 66 and the junction of the termination resistors 68 and 70 with the input nodes 83 of their respective attenuator 84, 86. The differential input signals, IN+, IN−, are terminated by the effective termination resistances of the termination resistors 68 and 70 in parallel with the attenuation resistors 92 and 94. The output nodes 96 between the attenuation resistors 92 and 94 are coupled to the inverting and non-inverting inputs of the differential amplifier 88. The monitoring circuit 66 output signal $V_I$ is coupled to the plus input of a 1× differential gain correction amplifier 150 in the control circuit 80. The minus input of the differential gain correction amplifier 150 receives the adjustable termination voltage $V_{TERM}$ from the automated termination voltage generator 61. The differential gain correction amplifier 150 generates an output voltage equal to $(V_I - V_{TERM})$. The $(V_I - V_{TERM})$ output voltage is coupled to input summing node 152 of summing amplifier 154 through an active attenuation circuit 156 consisting of attenuation resistors 158 and 160. The adjustable termination voltage $V_{TERM}$ is also coupled to the summing node 152 via resistor 162. The summing amplifier 154 generates an output voltage equal to $V_{TERM} + 0.1428 \times (V_I - V_{TERM})$ where the scalar term 0.1428 is a function of the attenuation factor of the attenuation circuit 156. The output of the summing amplifier 154 is coupled to the input of the $V_T$ drive amplifier 116. The voltage gain for the $V_T$ drive amplifier 116 is set by the resistors 165 and 166 that provides a 1.5556 scaling factor for generating a voltage output of $V_T = 1.5556 \times V_{TERM} + 0.2222 \times (V_I - V_{TERM})$ and a drive current $I_T$ which is coupled to the common node 82 of the termination resistors 68 and 70.

The adjustable termination voltage $V_{TERM}$ is further coupled to summing node 164 via resistor 168. The output of the differential gain correction amplifier 150 is also coupled to the summing node 164 via resistor 170 where resistors 168 and 170 have substantially the same resistive values. The input voltage to the summing node 164 has a value of $V_{TERM}+(V_I-V_{TERM})$ that is coupled to the input of the $V_A$ drive amplifier 118. A gain resistor 172 coupled across the $V_A$ driver amplifier 118 together with the summing node resistors 168 and 170 provides a –0.6667 scaling factor for generating an output voltage of $V_A=-0.6667 \times V_{TERM}-0.6667 \times (V_I-V_{TERM})$ and scaled compensation voltage drive current $I_A$ which is coupled to the common node 90 of the attenuators 84 and 86.

The drive currents $I_T$ and $I_A$ from the drive amplifiers 116 and 118 are sensed by series sense resistors 130 and 138. The voltages on each side of the resistors 130 and 138 are coupled to the difference gain amplifiers 132 and 140. The difference outputs from the gain amplifiers 132 and 140 are coupled through resistors 134 and 142 to the summing node input 136 of the error integrator amplifier 144. The output of the error integrator amplifier 144 is the adjustable termination voltage $V_{TERM}$ that is coupled to the input of the control circuit 80. The adjustable termination voltage $V_{TERM}$ from the error integrator amplifier 144 may be coupled to a $V_{TERM}$ monitoring circuit for detecting a saturated error integrator amplifier condition. When a saturated error integrator amplifier condition is detected, the $V_{TERM}$ monitoring circuit generates a $V_{TERM}$ OFF signal that causes switch 148 to couple a ground connected pull-down resistor 174 to the $V_{TERM}$ input to the control circuit 80. Error integrator amplifier 144 saturation may occur if the input source resistance is too large, such a when the input signal is AC coupled to the input differential termination and attenuation network 60. In this case, the input source resistance is effectively infinity and no DC common mode input signal current is present. Without the feedback provided by sufficiently large input signal currents, the error integrator amplifier 144 will saturate to a voltage near one of the power supply rails of the amplifier 144. To prevent the error integrator amplifier 144 from remaining in the saturated condition, the $V_{TERM}$ OFF signal also causes a $V_{TERM}$ clamp switch 176 to close and place a shunt resistor 178 across the integrating capacitor 146 to short the capacitor out and force the amplifier 144 to an idle condition. A $V_I$ monitoring circuit is used in conjunction with the $V_{TERM}$ monitoring circuit to generate a $V_{TERM}$ ON signal when a low input source DC common mode input signal is applied to the inputs 62, 64 of the input differential termination and attenuator network 60. The $V_{TERM}$ ON signal causes the switch 148 to couple the output of the error integrator amplifier 144 to the control circuit 80 and switch 176 to open to remove the shunt resistor 178 from across the integrating capacitor 146. Further, the output of the difference gain amplifier 132 may be coupled to an overload current monitoring circuit for detecting an overload current condition from the drive amplifier 116. The overload current monitoring circuit generates an output signal that results in the display of an overload status signal when the current level of the drive amplifier exceeds a windowed threshold level. The input differential termination and attenuation network 60 has a preferred DC common mode signal input range of ±2.5V. DC common mode signal inputs that exceed this range will cause the drive amplifier 116 to operate outside the designed linear range of the amplifier.

Figure 8:
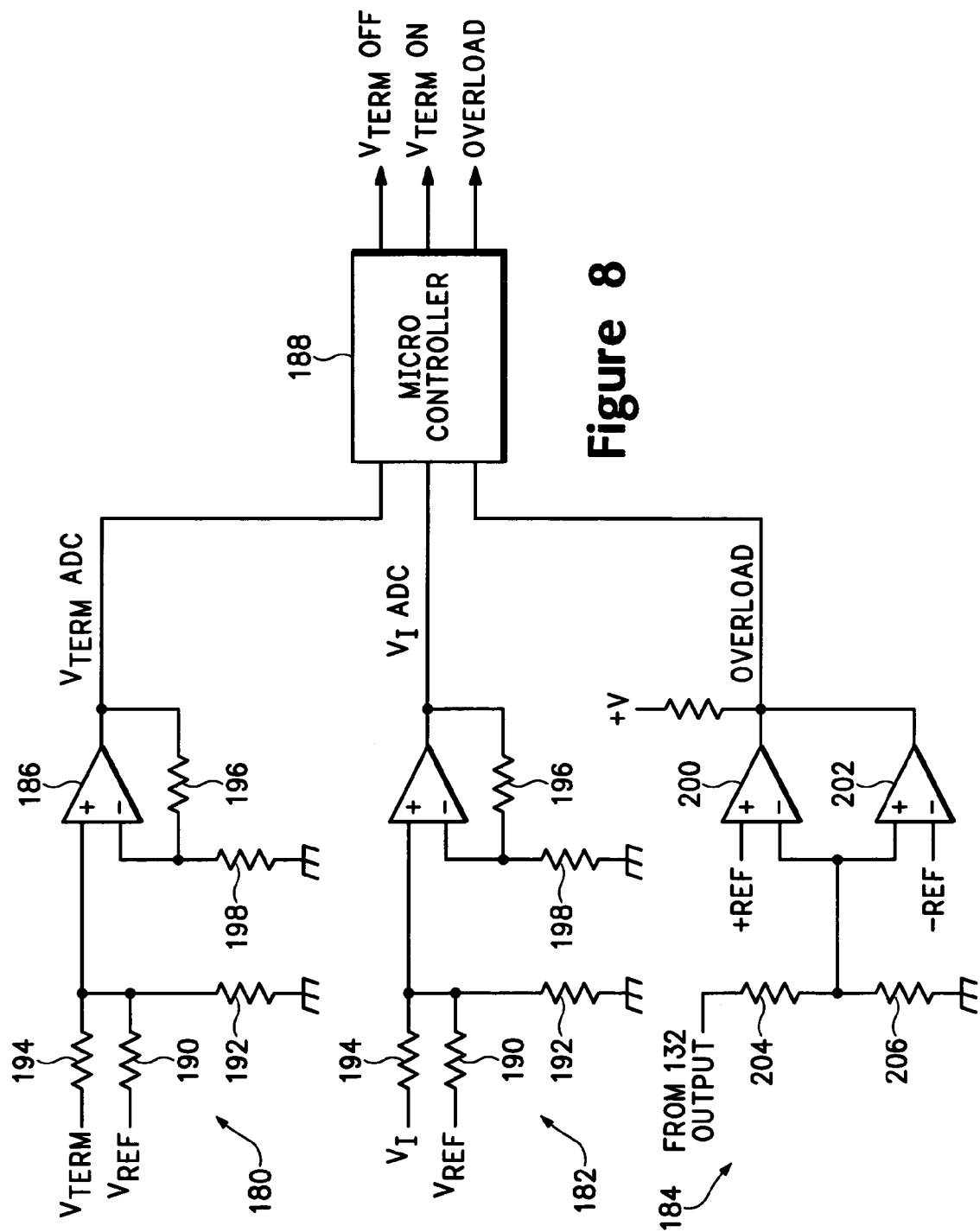
FIG. 8 is a schematic representation of monitoring circuits usable in the input differential termination and attenuator network having an automated common mode termination voltage generator according to the present invention.

Referring to FIG. 8, there is shown a schematic representation of the adjustable termination voltage $V_{TERM}$ monitoring circuit 180, $V_I$ monitoring circuit 182 and the overload current monitoring circuit 184. The $V_{TERM}$ monitoring circuit 180 and the $V_I$ monitoring circuit 182 are of similar design with each having a buffer amplifier 186 that scales and offsets the respective adjustable termination voltage $V_{TERM}$ and $V_I$ voltage from the monitoring circuit 66 relative to a reference voltage $V_{REF}$, so that they can be monitored by a unipolar analog-to-digital converter in microcontroller 188. The ±2.5V adjustable termination voltage $V_{TERM}$ range and the ±2.5V $V_I$ voltage range are scaled by the buffer amplifiers 186 from ±250 bits at 10 mV/bit down to 4 mV/bit resolution of the microcontroller 188. The ±2.5V adjustable termination voltage $V_{TERM}$ range and the $V_I$ voltage range are also offset so that a 0V input maps to the center of the analog-to-digital converter range at 2.048V. The resistive summing networks of resistors 190, 192 and 194 in the front of the buffer amplifiers 186 provides a voltage on the respective non-inverting inputs of the amplifiers of $0.2855 \times V_{TERM}+1.4634V$ and $0.2855 \times V_I+1.4634V$. Gain resistors 196 and 198 coupled to the inverting input of the buffer amplifier 186 provides a gain of 1.4× and completes the unipolar scaling with the following results: $V_{TERM}ADC=0.4 \times V_{TERM}+2.048V$ and $V_I ADC=0.4 \times V_{TERM}+2.048V$.

The analog-to-digital converters in the microcontroller 188 convert the scaled and offset adjustable termination voltage $V_{TERM}ADC$ and the $V_I$ voltage $V_I ADC$ to digital values. The digital representation of the scaled and offset adjustable termination voltage is processed by the microcontroller 188 using stored instructions to determine if the adjustable termination voltage $V_{TERM}$ from the error integrator amplifier 144 exceeds a threshold saturation condition of ±2.9V. When a saturated condition is detected, the microcontroller 188 outputs a $V_{TERM}$ OFF signal to switch 148 which grounds the applied termination voltage $V_{TERM}$ input to the control circuit 80 through pull-down resistor 174 and shorts the integrating capacitor 146 through resistor 178. The microcontroller 188 may also activate an LED mounted on the differential measurement probe 44 to indicate the saturation condition or display an applied termination voltage saturation condition message on the display device 50 of the oscilloscope 40.

With no DC common mode input signal current present and the adjustable termination voltage input to the control circuit 80 set to zero volts by the pull-down resistor 174, the output signal $V_I$ from the monitoring circuit 66 is zero volts. By monitoring the output signal $V_I$ with the $V_I$ monitoring circuit 182, the microcontroller 188 can generate a $V_{TERM}$ ON signal to the automated termination voltage generator 61 when the $V_I$ signal is greater than a set threshold level. In the preferred embodiment, the threshold level is greater than ±50 mV. The $V_{TERM}$ ON signal causes switch 148 to couple the output of the error integrator amplifier 144 to the input of the control circuit 80 and disconnect the shunt resistor 178 from across the integrating capacitor 146. The saturation condition LED or display is also removed.

The overload current monitoring circuit 184 is configured as a window comparator having comparators 200 and 202 coupled to the output of the differential gain amplifier 132. The differential gain amplifier output is attenuated by a voltage divider consisting of resistors 204 and 206 and coupled to the inverting input of comparator 200 and the non-inverting input of comparator 202. The non-inverting input of comparator 200 is coupled to a positive reference source and the inverting input of comparator 202 is coupled to a negative reference source. The positive and negative reference sources are equal and opposite each other and accurately controlled. The window comparator combines both positive and negative load current threshold detection into a single active-LO logic output signal. If the driver amplifier 116 source current exceeds the linear range of the amplifier, the voltage signal on the inverting input of comparator 200 will exceed the positive reference source on the non-inverting input, which pulls the output of the comparator 200 low. Conversely, if the drive amplifier sinks current that exceeds the linear range of the amplifier, the voltage signal on the non-inverting input of comparator 202 will exceed the negative reference source on the inverting input, which pulls the output of comparator 202 low. In the preferred embodiment of the invention, overload current monitoring circuit 184 generates an active-LO for current outputs from drive amplifier 116 in excess of 82.5 mA. The active-LO signal is coupled to the microcontroller 188 which generates an output signal which activates an LED mounted on the differential measurement probe 44 to indicate the overload condition or causes an overload condition message to be displayed on the display device 50 of the oscilloscope 40. The Active-LO signal is removed from the output of the overload current monitoring circuit 184 when the drive amplifier source or sink current falls to within the linear range of the amplifier. This results in the microcontroller 188 turning off the overload status display.

The above description was based on a matched 50 ohm source impedance. The DC common mode compensation described in this invention is also valid for other balanced input source impedance values. The below equations describe the compensation network topology voltages for three common source impedance cases. The AC-coupled source impedance case is effectively describing the result of an infinite DC source resistance. The below equations are shown in relation to the DC common mode voltage $V_{CM}$ instead of the term $(V_I-V_{TERM})$.

Zero Ohm Source Impedance $$V_T=1.3333 \times V_{TERM}+0.2222 \times V_{CM}$$

$$V_A=-0.6667 \times V_{CM}$$

$$V_I=V_{CM}$$

50 Ohm Source Impedance $$V_T=1.4444 \times V_{TERM}+0.1111 \times V_{CM}$$

$$V_A=0.3333 \times V_{TERM}-0.3333 \times V_{CM}$$

$$V_I=0.5(V_{TERM}+V_{CM})$$

AC-Coupled Source Impedance $$V_T=1.5556 \times V_{TERM}$$

$$V_A=-0.6667 \times V_{TERM}$$

$$V_I=V_{TERM}$$

The input differential termination and attenuation network 60 having the automated common mode termination voltage generator 61 of the present invention has a response down to DC that allows for differential mode DC signals to be processed. In the case of an unbalanced, differential mode DC signal input $V_{DM}$ applied to the IN+ signal input 62 and zero volts applied to the IN− signal input 64, the input differential termination and attenuation network 60 still attempts to balance the common mode DC voltage at the differential amplifier 88 inputs. In the case of the differential mode DC signal just described, from a zero ohm source impedance, the resulting differential amplifier 88 input DC voltages are:

$$\text{INPUT+}=+0.2 \times V_{DM}$$

$$\text{INPUT−}=-0.2 \times V_{DM}$$

The above equations show that the differential mode DC input has the correct 2.5× attenuation and has been level shifted to give a zero common mode signal at the inputs of the differential amplifier 88. Even for differential mode DC inputs, the input differential termination and attenuation network 60 attempts to maximize the dynamic range of the differential amplifier 88.

The above invention has been described in relation to an differential termination and attenuation network 60 having an effective 50 ohm termination and an attenuation factor of 2.5×. These particular parameters result in scalars A, B, C, and D of $V_T$ and $V_A$ being a specified value. The present invention may also be implemented for different effective differential termination values and different attenuation factors which would result in different scaling factors for $V_T$ and $V_A$. Further, the present invention is optimized for maximizing the dynamic range of the output differential amplifier 88. To achieve this parameter, the scaled compensation voltage $V_A$ is set to provide a substantially fixed zero volt DC common mode voltage to the inverting and non-inverting input of the differential amplifier 88 in relation to the input DC common mode voltage $V_{CM}$.

A differential termination and attenuator network having an automated common mode termination voltage generator has been described having first and second input termination resistors coupled in parallel with corresponding resistive attenuator circuits. A monitoring circuit is coupled to input nodes of the network and generates an output signal representative of the combination of a DC common mode voltage on the input nodes and an adjustable termination voltage. A control circuit receives the output signal from the monitoring circuit and the adjustable termination voltage and generates a scaled termination voltage and drive current and a scaled compensation voltage and drive current. The scaled termination voltage and drive current and the scaled compensation voltage and drive current provide DC currents through the input termination resistances and the attenuators for nulling DC currents at the network input nodes and provides a DC common mode voltage output from the first and second attenuators for optimizing the dynamic range of the differential measurement amplifier. The monitoring circuit output signal is coupled to the termination voltage generator in a first embodiment for generating the applied termination voltage which is substantially equal to the DC common mode voltage on the input nodes of the network. In the preferred embodiment, the termination voltage generator has sensing circuits which monitor the scaled termination voltage drive current and the scaled compensation voltage drive current and generate output voltages that are summed and applied to the input node of an integrating amplifier that generates the adjustable termination voltage which minimizes DC common mode loading. An adjustable termination voltage monitoring circuit, $V_I$ monitoring circuit and an overload current monitoring circuit and may be included to provide optimum circuit operation with varying signal input conditions.

It will be obvious to those having skill in the art that many changes may be made to the details of the above-described embodiments of this invention without departing from the underlying principles thereof. The scope of the present invention should, therefore, be determined only by the following claims.

What is claimed is:

1. A differential termination and attenuator network having an automated common mode termination voltage generator receiving a DC common mode voltage from a voltage source having source resistances and coupled to a differential amplifier comprising:
   first and second input termination resistances having a common node and respective input nodes receiving the DC common mode voltage from the voltage source;
   first and second attenuators having a common node and respective input nodes and output nodes with each respective input node coupled to one of the first and second input termination resistances;
   a monitoring circuit coupled to the input nodes of the first and second input termination resistances for generating an output signal representative of the combination of the DC common mode voltage on the input source resistances and voltage representative of an adjustable termination voltage on the input termination resistances;
   an automated termination voltage generator receiving the output signal from the monitoring circuit and generating the adjustable termination voltage substantially equal to the DC common mode voltage on the input source resistances; and
   a control circuit receiving the adjustable termination voltage and the monitoring circuit output signal and generating a scaled termination voltage and drive current and a scaled compensation voltage and drive current that are a function of the adjustable termination voltage and the DC common mode voltage with the scaled termination voltage and drive current coupled to the common node of the first and second input termination resistances and the scaled compensation voltage and drive current coupled to the common node of the first and second attenuators for providing DC currents through the first input termination resistance and first attenuator and the second input termination resistance and second attenuator for nulling DC currents at the input nodes of the first and second input termination resistances and provides a DC common mode voltage at the output nodes of the first and second attenuators for optimizing the dynamic range of the differential amplifier.

2. The differential termination and attenuator network having an automated common mode termination voltage generator as recited in claim 1 wherein the monitoring circuit comprises a resistive voltage divider network having high impedance inputs relative to the first and second input termination resistances.

3. The differential termination and attenuator network having an automated common mode termination voltage generator as recited in claim 1 wherein the respective first and second input termination resistances further comprise respective first and second input termination resistors with the first input termination resistor coupled in parallel with the first attenuator and the second input termination resistor coupled in parallel with the second attenuator.

4. The differential termination and attenuator network having an automated common mode termination voltage generator as recited in claim 3 wherein each of the first and second attenuators comprise first and second resistors with one side of the first resistor coupled to one of the first and second input termination resistors and the other side coupled to one side of the second resistor at the output node of the attenuator and the other side of the second resistor coupled to receive the scaled compensation voltage and drive current at the common node of the first and second attenuators.

5. The differential termination and attenuator network having an automated common mode termination voltage generator as recited in claim 4 wherein the scaled termination and scaled compensation voltages have scaling factors that are a function of the first and second input termination resistors and the first and second resistors of the respective first and second attenuators.

6. The differential termination and attenuator network having an automated common mode termination voltage generator as recited in claim 5 wherein the scaled termination voltage has a first scaling factor providing a first voltage proportional to the adjustable termination voltage and a second scaling factor providing a correction voltage proportional to the difference between the DC common mode voltage on the input nodes of the first and second input termination resistances and the adjustable termination voltage.

7. The differential termination and attenuator network having an automated common mode termination voltage generator as recited in claim 5 wherein the scaled compensation voltage has a first scaling factor providing a first voltage proportional to the adjustable termination voltage and a second scaling factor providing a correction voltage proportional to the difference between the DC common mode voltage on the input nodes of the first and second input termination resistances and the adjustable termination voltage.

8. The differential termination and attenuator network having an automated common mode termination voltage generator as recited in claim 1 wherein the automated termination voltage generator comprises an analog voltage feedback circuit driven by the monitoring circuit.

9. The differential termination and attenuator network having an automated common mode termination voltage generator as recited in claim 1 wherein the automated termination voltage generator comprises:
   an analog-to-digital converter receiving the output signal from the monitoring circuit for generating digital values representative of the monitoring circuit output signal;
   a microcontroller coupled to receive the digital values from the analog-to-digital converter and generating digital values representative of the adjustable termination voltage that is substantially equal to the DC common mode voltage on the input source resistances; and
   a digital-to-analog converter coupled to receive the digital values representative of the adjustable termination voltage and generating an analog voltage substantially equal to the DC common mode voltage on the input source resistances.

10. The differential termination and attenuator network having an automated common mode termination voltage generator as recited in claim 9 wherein the analog-to-digital converter and the digital-to-analog converter are disposed in the microcontroller.

11. The differential termination and attenuator network having an automated common mode termination voltage generator as recited in claim 1 wherein the control circuit further comprises:
   a differential amplifier receiving the output signal from the monitoring circuit and the adjustable termination voltage and generating an output signal representative of the difference between the output signal from the monitoring circuit and the adjustable termination voltage;

a first summing node coupled to receive the adjustable termination voltage and the output signal from the differential amplifier and generating an output signal representative of the adjustable termination voltage and an attenuated representation of the output signal from the differential amplifier;

a second summing node coupled to receive the adjustable termination voltage and the output signal from the differential amplifier and generating an output signal representative of the adjustable termination voltage and the output signal from the differential amplifier;

a first drive amplifier having a scaling gain factor and coupled to receive the output signal from the first summing node for generating the scaled termination voltage and drive current; and a second drive amplifier having a scaling gain factor and coupled to receive the output signal from the second summing node for generating the scaled compensation voltage and drive current.

12. The differential termination and attenuator network having an automated common mode termination voltage generator as recited in claim 11 wherein the first summing node comprises an active attenuation circuit receiving the output signal from the differential amplifier and a summing amplifier having an input node coupled to receive the adjustable termination voltage and coupled to an intermediate node of the attenuation circuit for receiving the attenuated representation of the output signal from the differential amplifier and generating the output signal representative of the adjustable termination voltage and the attenuated representation of the output signal from the differential amplifier.

13. The differential termination and attenuator network having an automated common mode termination voltage generator as recited in claim 1 wherein the scaled compensation voltage produces a substantially zero volts DC common mode voltage from the first and second attenuators.

14. A differential termination and attenuator network having an automated common mode termination voltage generator receiving a DC common mode voltage from a voltage source having source resistances and coupled to a differential amplifier comprising:

first and second input termination resistances having a common node and respective input nodes receiving the DC common mode voltage from the voltage source;

first and second attenuators having a common node and respective input nodes and output nodes with each respective input node coupled to one of the first and second input termination resistances;

a monitoring circuit coupled to the input nodes of the first and second input termination resistances for generating an output signal representative of the combination of the DC common mode voltage on the input source resistances and an adjustable termination voltage on the input termination resistances;

a control circuit receiving the adjustable termination voltage and the monitoring circuit output signal and generating a scaled termination voltage and drive current and a scaled compensation voltage and drive current that are a function of the adjustable termination voltage and the DC common mode voltage with the scaled termination voltage and drive current coupled to the common node of the first and second input termination resistances and the scaled compensation voltage and drive current coupled to the common node of the first and second attenuators for providing DC currents through the first input termination resistance and first attenuator and the second input termination resistance and second attenuator for nulling DC currents at the input nodes of the first and second input termination resistances and provides a DC common mode voltage at the output nodes of the first and second attenuators for optimizing the dynamic range of the differential amplifier; and an automated termination voltage generator having respective sensing circuits for monitoring the scaled termination voltage drive current and the scaled compensation voltage drive current and generating respective output voltages representative of the scaled termination voltage drive current and the scaled compensation voltage drive current that are combined at a summing node and coupled to an input of a integrating amplifier for generating the adjustable termination voltage to the control circuit.

15. The differential termination and attenuator network having an automated common mode termination voltage generator as recited in claim 14 wherein the monitoring circuit comprises a resistive voltage divider network having high impedance inputs relative to the first and second input termination resistances.

16. The differential termination and attenuator network having an automated common mode termination voltage generator as recited in claim 14 wherein the respective first and second input termination resistances further comprise respective first and second input termination resistors coupled in parallel with the respective first and second attenuators.

17. The differential termination and attenuator network having an automated common mode termination voltage generator as recited in claim 16 wherein each of the first and second attenuators comprise first and second resistors with one side of the first resistor coupled to one of the first and second input termination resistors and the other side coupled to one side of the second resistor at the output node of the attenuator and the other side of the second resistor coupled to receive the scaled compensation voltage and drive current at the common node of the first and second attenuators.

18. The differential termination and attenuator network having an automated common mode termination voltage generator as recited in claim 17 wherein the scaled termination and scaled compensation voltages have scaling factors that are a function of the first and second input termination resistors and the first and second resistors of the respective first and second attenuators.

19. The differential termination and attenuator network having an automated common mode termination voltage generator as recited in claim 18 wherein the scaled termination voltage has a first scaling factor providing a first voltage proportional to the adjustable termination voltage and a second scaling factor providing a correction voltage proportional to the difference between the DC common mode voltage on the input nodes of the first and second input termination resistances and the adjustable termination voltage.

20. The differential termination and attenuator network having an automated common mode termination voltage generator as recited in claim 18 wherein the scaled compensation voltage has a first scaling factor providing a first voltage proportional to the adjustable termination voltage and a second scaling factor providing a correction voltage proportional to the difference between the DC common mode voltage on the input nodes of the first and second termination resistances and the adjustable termination voltage.

21. The differential termination and attenuator network having an automated common mode termination voltage generator as recited in claim 14 wherein the scaled compensation voltage and drive current produces a substantially zero volts DC common mode voltage from the first and second attenuators.

22. The differential termination and attenuator network having an automated common mode termination voltage generator as recited in claim 14 wherein the control circuit further comprises:
  a differential amplifier receiving the output signal from the monitoring circuit and the adjustable termination voltage and generating an output signal representative of the difference between the output signal from the monitoring circuit and the adjustable termination voltage;
  a first summing node coupled to receive the adjustable termination voltage and the output signal from the differential amplifier and generating an output signal representative of the adjustable termination voltage and an attenuated representation of the output signal from the differential amplifier;
  a second summing node coupled to receive the adjustable termination voltage and the output signal from the differential amplifier and generating an output signal representative of the adjustable termination voltage and the output signal from the differential amplifier;
  a first drive amplifier having a scaling gain factor and coupled to receive the output signal from the first summing node for generating the scaled termination voltage and drive current; and
  a second drive amplifier having a scaling gain factor and coupled to receive the output signal from the second summing node for generating the scaled compensation voltage and drive current.

23. The differential termination and attenuator network having an automated common mode termination voltage generator as recited in claim 22 wherein the first summing node comprises an active attenuation circuit receiving the output signal from the differential amplifier and a summing amplifier having an input node coupled to receive the adjustable termination voltage and coupled to an intermediate node of the attenuation circuit for receiving the attenuated representation of the output signal from the differential amplifier and generating the output signal representative of the adjustable termination voltage and the attenuated representation of the output signal from the differential amplifier.

24. The differential termination and attenuator network having an automated common mode termination voltage generator as recited in claim 22 wherein each of the automated termination voltage generator sensing circuits further comprises a sensing resistor coupled in series with the output of one of the first and second drive amplifiers for generating an output voltage from each side of the sensing resistor, the output voltages on either side of the sensing resistor coupled to inverting and non-inverting inputs of a differential gain amplifier whose amplified output represents one of the scaled termination voltage drive current and the scaled compensation voltage drive current.

25. The differential termination and attenuator network having an automated common mode termination voltage generator as recited in claim 14 further comprising an adjustable termination voltage monitoring circuit having an amplifier coupled to receive the adjustable termination voltage from the automated termination voltage generator and a reference voltage for generating a scaled and offset adjustable termination voltage with the scaled and offset adjustable termination voltage being coupled to a microcontroller that converts the scaled and offset adjustable termination voltage to digital values for processing by the microcontroller to generate an output signal when the scaled and offset adjustable termination voltage is greater than a threshold level, the output signal coupled to first and second switches with the first switch coupling the adjustable termination voltage input to the control circuit to zero volts via a pull-down resistor and the second switch coupling a shunt resistor across the integrating amplifier.

26. The differential termination and attenuator network having an automated common mode termination voltage generator as recited in claim 25 further comprising a monitoring circuit for the monitoring circuit output signal having an amplifier coupled to receive the output signal from the monitoring circuit and a reference voltage for generating a scaled and offset output signal with the scaled and offset output signal being coupled to a microcontroller that converts the scaled and offset adjustable output signal to digital values for processing by the microcontroller to generate an output signal when the scaled and offset output signal is greater than a threshold level, the output signal coupled the first and second switches with the first switch coupling the adjustable termination voltage input to the control circuit and the second switch de-coupling a shunt resistor from across the integrating amplifier.

27. The differential termination and attenuator network having an automated common mode termination voltage generator as recited in claim 26 wherein the microcontroller receives the output signal from the monitoring circuit and converts the output signal from the monitoring circuit to digital values for processing by the microcontroller to generate an output signal when the output signal from the monitoring circuit is greater than a threshold value to de-coupled the pull-down resistor from the adjustable termination voltage input to the control circuit.

28. The differential termination and attenuator network having an automated common mode termination voltage generator as recited in claim 14 further comprising an overload current monitoring circuit having a window comparator receiving the output voltage representative of the scaled termination voltage drive current from the sensing circuits and positive and negative reference voltages for generating an active-LO output signal when the output voltage representative of the scaled termination voltage drive current from the sensing circuits exceeds the positive and negative reference voltages, the active-LO output signal coupled to a microcontroller that generates an output signal for displaying an overload condition status.

\* \* \* \* \*